US011177341B2

(12) United States Patent
Kim et al.

(10) Patent No.: US 11,177,341 B2
(45) Date of Patent: Nov. 16, 2021

(54) DISPLAY DEVICE

(71) Applicant: SAMSUNG DISPLAY CO., LTD., Yongin-si (KR)

(72) Inventors: Dong Hyun Kim, Seoul (KR); Gun Hee Kim, Seoul (KR); Soo Hyun Moon, Incheon (KR); Seung Chan Lee, Hwaseong-si (KR); Joo Hee Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/923,932

(22) Filed: Jul. 8, 2020

(65) Prior Publication Data

US 2021/0013291 A1   Jan. 14, 2021

(30) Foreign Application Priority Data

Jul. 9, 2019   (KR) .................. 10-2019-0082701

(51) Int. Cl.
*H01L 27/32* (2006.01)
*H01L 51/00* (2006.01)
*H01L 51/56* (2006.01)

(52) U.S. Cl.
CPC ........ *H01L 27/3276* (2013.01); *H01L 51/003* (2013.01); *H01L 51/0097* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 6,815,827 B2 | 11/2004 | Vieux-Rochaz et al. | |
| 8,557,700 B2 | 10/2013 | Ishihara | |
| 9,818,732 B2 | 11/2017 | Jung et al. | |
| 2017/0062760 A1* | 3/2017 | Kim | H01L 27/3276 |
| 2017/0148826 A1* | 5/2017 | Choi | H01L 27/1244 |
| 2018/0014399 A1 | 1/2018 | Chung et al. | |
| 2018/0175324 A1* | 6/2018 | Fujioka | H01L 51/003 |

FOREIGN PATENT DOCUMENTS

| | | |
|---|---|---|
| KR | 10-2013-0123684 A | 11/2013 |
| KR | 10-2017-0060215 A | 6/2017 |

* cited by examiner

*Primary Examiner* — J.E. Schoenholtz
(74) *Attorney, Agent, or Firm* — Lewis Roca Rothgerber Christie LLP

(57) ABSTRACT

A display device includes a flexible substrate which includes a first surface and a second surface opposite to the first surface and includes, sequentially, a first portion in the display region, a second portion in the non-display region, a third portion bent in a direction opposite to a display surface, a fourth portion, a fifth portion bent in a direction toward the display surface, and a sixth portion; a plurality of signal wirings on the first surface at the second to sixth portions; and a plurality of first connection wirings on the second surface at the second portion, and the second portion overlaps with the fourth portion, the fifth portion, and the sixth portion, and the signal wirings and the first connection wirings are coupled to each other on the second surface at the second portion.

20 Claims, 17 Drawing Sheets

110: 111, 112, 113, 114, 115, 116

110: 111, 112, 113, 114, 115, 116

110: 111, 112, 113, 114, 115, 116

DISPLAY DEVICE

CROSS-REFERENCE TO RELATED APPLICATION

This application claims priority to and the benefit of Korean Patent Application No. 10-2019-0082701, filed on Jul. 9, 2019 in the Korean Intellectual Property Office, the entire disclosure of which is incorporated herein by reference.

BACKGROUND

1. Field

Aspects of embodiments of the present disclosure relate to a display device.

2. Description of the Related Art

Display devices may be used in portable electronic devices, such as mobile phones, smartphones, tablet personal computers (PCs), smart watches, watch phones, mobile communication terminals, electronic notebooks, electronic books, portable multimedia players (PMPs), navigation devices, and ultra-mobile PCs (UMPCs), and may also be used as display screens of various products, such as televisions, notebooks, monitors, billboards, and devices for Internet of things (IoT).

Among the display devices, a flexible display device, which is bendable or foldable like paper and displays a screen by disposing a display and a driver on a flexible substrate including a flexible material, has attracted attention. In the flexible display device, signal wirings connected from the display are disposed on one surface of the flexible substrate, and a driving integrated circuit is mounted at an end of the signal wirings. In this case, when the mounted driving integrated circuit is mounted on the other surface of the flexible substrate, signal wirings disposed in the driver of the flexible substrate may be cracked due to a stepped portion of the driving integrated circuit itself.

SUMMARY

According to an aspect of embodiments of the present disclosure, a display device is provided in which cracks of signal wirings of a driver of a flexible substrate are prevented or substantially prevented when a driving integrated circuit is mounted.

It is to be understood that aspects and objects of the present disclosure are not limited to the above-described aspects and objects, and other aspects and objects of the present disclosure will be apparent to those skilled in the art from the following descriptions.

According to one or more embodiments of the present disclosure, a display device includes a display region including a plurality of pixels and a non-display region at a side of the display region, the display device including a flexible substrate including a first surface and a second surface opposite to the first surface, the flexible substrate including, sequentially, a first portion in the display region, a second portion in the non-display region, a third portion bent in a direction opposite to a display surface, a fourth portion, a fifth portion bent in a direction toward the display surface, and a sixth portion; a plurality of signal wirings on the first surface at the second to sixth portions of the flexible substrate; and a plurality of first connection wirings on the second surface at the second portion of the flexible substrate, wherein the second portion overlaps with the fourth portion, the fifth portion, and the sixth portion, and the signal wirings and the first connection wirings are coupled to each other on the second surface at the second portion of the flexible substrate.

The first portion, the second portion, the fourth portion, and the sixth portion of the flexible substrate may include flat surfaces.

A width of the third portion of the flexible substrate in the direction toward the display surface may be greater than a width of the fifth portion in the direction toward the display surface.

The display device may further include a driving integrated circuit on the second surface at the second portion of the flexible substrate, wherein the first connection wirings are electrically connected to the driving integrated circuit.

The display device may further include a printed circuit board and second connection wirings on the second surface of the flexible substrate, wherein the second connection wirings electrically connect the printed circuit board and the driving integrated circuit.

The first connection wirings and the second connection wirings may be directly on the second surface of the flexible substrate.

The display device may further include a space and a double-sided tape, wherein the space is located between the third portion and the sixth portion of the flexible substrate, and the double-sided tape is located in the space.

The display device may further include a spacer between the third portion of the flexible substrate and the double-sided tape, wherein the spacer is in direct contact with the third portion of the flexible substrate and a side surface of the double-sided tape.

The display device may further include a driving integrated circuit on the second surface at the second portion of the flexible substrate, wherein the first connection wirings are electrically connected to the driving integrated circuit.

The display device may further include a conductive coupling layer between the signal wirings and the first connection wirings, wherein the conductive coupling layer electrically couples the signal wirings and the first connection wirings.

The display device may further include a bending protection layer on the second surface at the third to fifth portions of the flexible substrate and exposing the first connection wirings at the sixth portion.

The display device may further include a rigid substrate which on the second surface at the first portion and the second portion of the flexible substrate and includes a third surface in contact with the flexible substrate and a fourth surface opposite to the third surface, wherein the first connection wirings are directly on the fourth surface of the rigid substrate.

The first connection wirings may be recessed from the second surface of the flexible substrate and may be inside the flexible substrate.

Each pixel of the display region may include at least one thin film transistor, and the signal wirings may be electrically connected to the thin film transistor.

According to one or more embodiments of the present disclosure, a display device includes a display region including a thin film transistor and a non-display region at a side of the display region, the display device including a flexible substrate which includes a first surface and a second surface opposite to the first surface, the flexible substrate including, sequentially, a first portion in the display region, a second portion in the non-display region, a third portion bent in a direction opposite to a display surface, a fourth portion, a fifth portion bent in a direction toward the display surface, and a sixth portion; a first conductive layer on the first surface of the flexible substrate; a second conductive layer on the first conductive layer; and a plurality of first connection wirings on the second surface at the second portion of the flexible substrate, wherein the first conductive layer includes a gate electrode on the first portion, the second conductive layer includes a source electrode and a drain electrode on the first portion and a plurality of signal wirings on the second to sixth portions, the second portion overlaps with the fourth portion, the fifth portion, and the sixth portion, and the signal wirings and the first connection wirings are coupled to each other on the second surface at the second portion of the flexible substrate.

The first portion, the second portion, the fourth portion, and the sixth portion of the flexible substrate may include flat surfaces.

A width of the third portion of the flexible substrate in the direction toward the display surface may be greater than a width of the fifth portion in the direction toward the display surface.

The display device may further include a driving integrated circuit on the second surface at the second portion of the flexible substrate, wherein the first connection wirings are electrically connected to the driving integrated circuit.

The display device may further include a printed circuit board and second connection wirings on the second surface of the flexible substrate, wherein the second connection wirings electrically connect the printed circuit board and the driving integrated circuit.

The first connection wirings and the second connection wirings may be directly on the second surface of the flexible substrate.

Other aspects and details of example embodiments are included in the following detailed description and the drawings.

BRIEF DESCRIPTION OF THE DRAWINGS

The above and other aspects and features of the present disclosure will become more apparent by describing some example embodiments thereof in further detail with reference to the drawings, in which.

DETAILED DESCRIPTION

Figure 1:
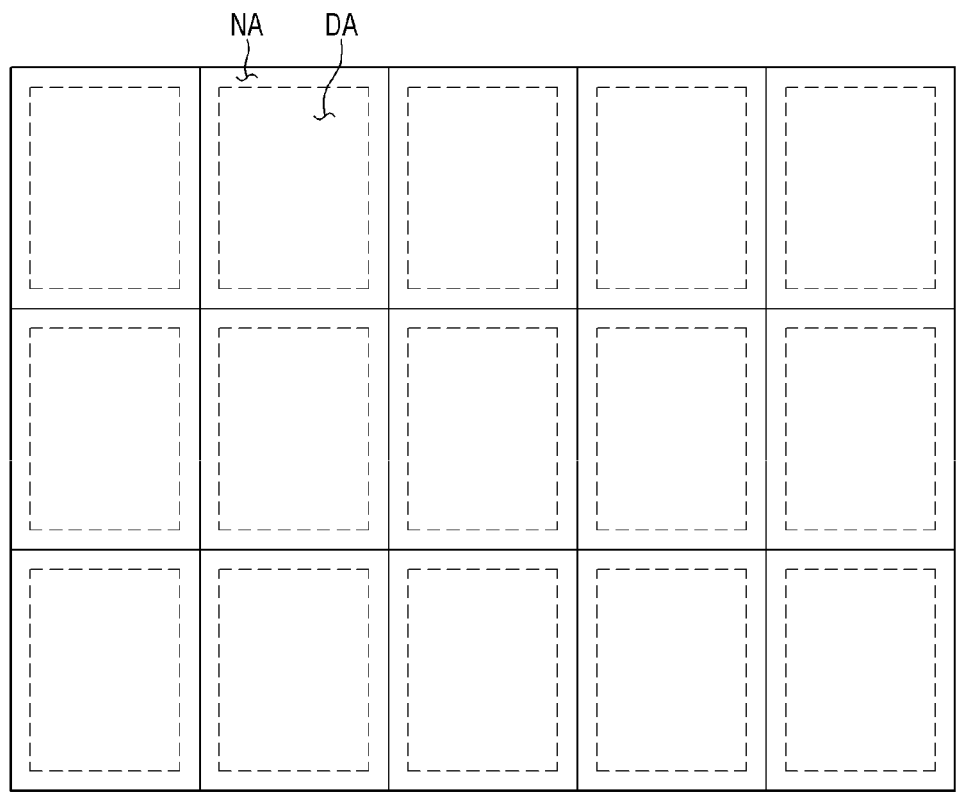
FIG. 1 is a plan view illustrating a display product including a plurality of display devices according to an example embodiment.
Figure 1:
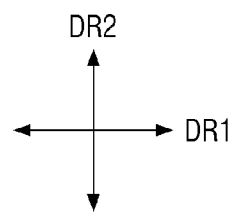

Aspects and features of the present disclosure and methods for accomplishing the same will be more clearly understood from some example embodiments described below with reference to the accompanying drawings. However, the present disclosure is not limited to the following example embodiments described below, but may be implemented in other forms. That is, the scope of the present disclosure is defined by the claims.

It is to be understood that when an element or layer is referred to as being "on," "connected to," or "coupled to" another element or layer, it may be directly on, connected, or coupled to the other element, or one or more intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. For example, the device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

The meaning of "include" or "comprise" may specify a property, a fixed number, a step, an operation, an element, a component, or a combination thereof, but does not exclude other properties, fixed numbers, steps, operations, elements, components, or combinations thereof.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Like reference numerals refer to like elements throughout the present specification and drawings.

Herein, some example embodiments of the present disclosure will be described with reference to the drawings.

Figure 2:
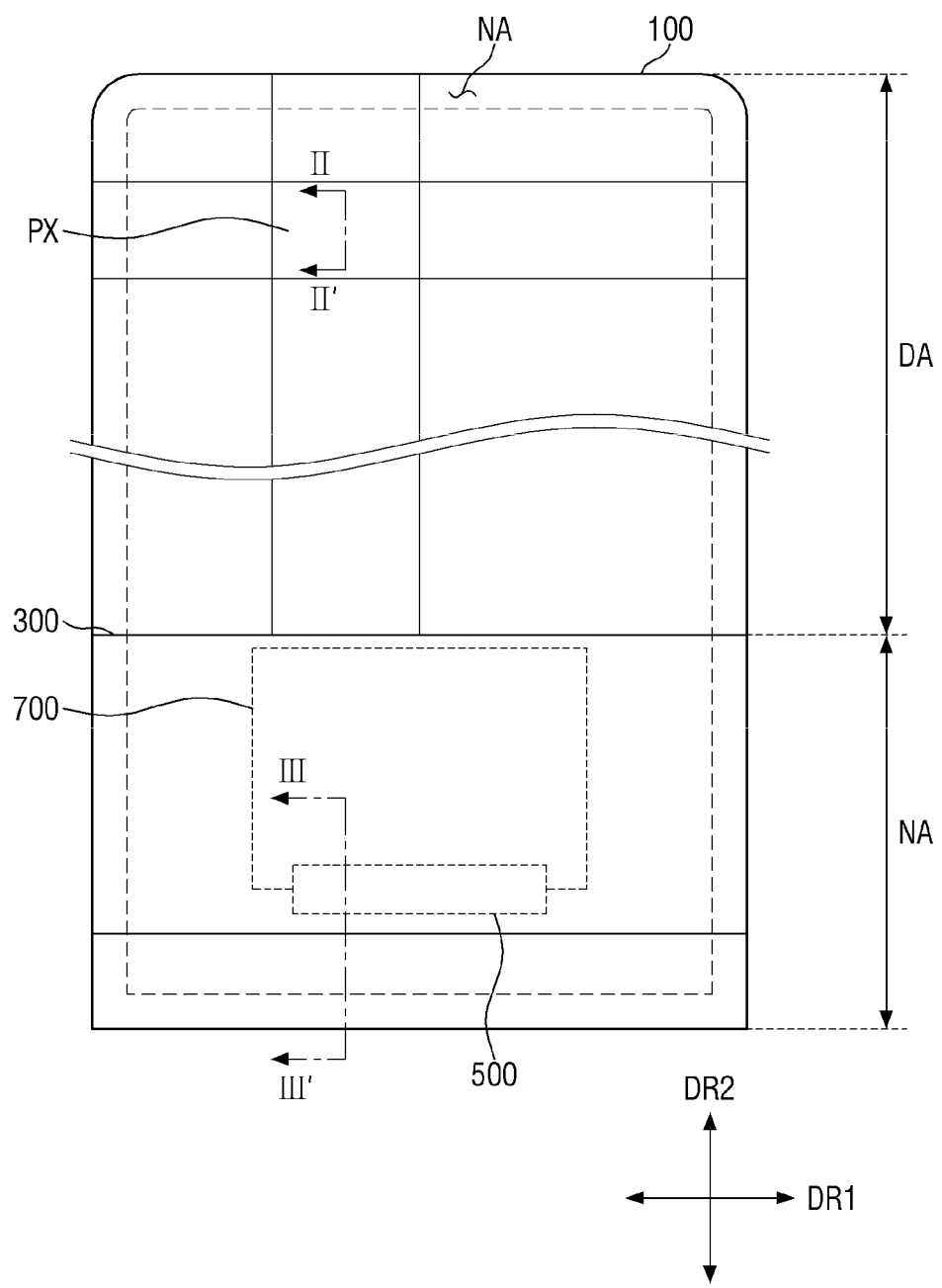
FIG. 2 is a plan view illustrating a display device according to an example embodiment.
Figure 3:
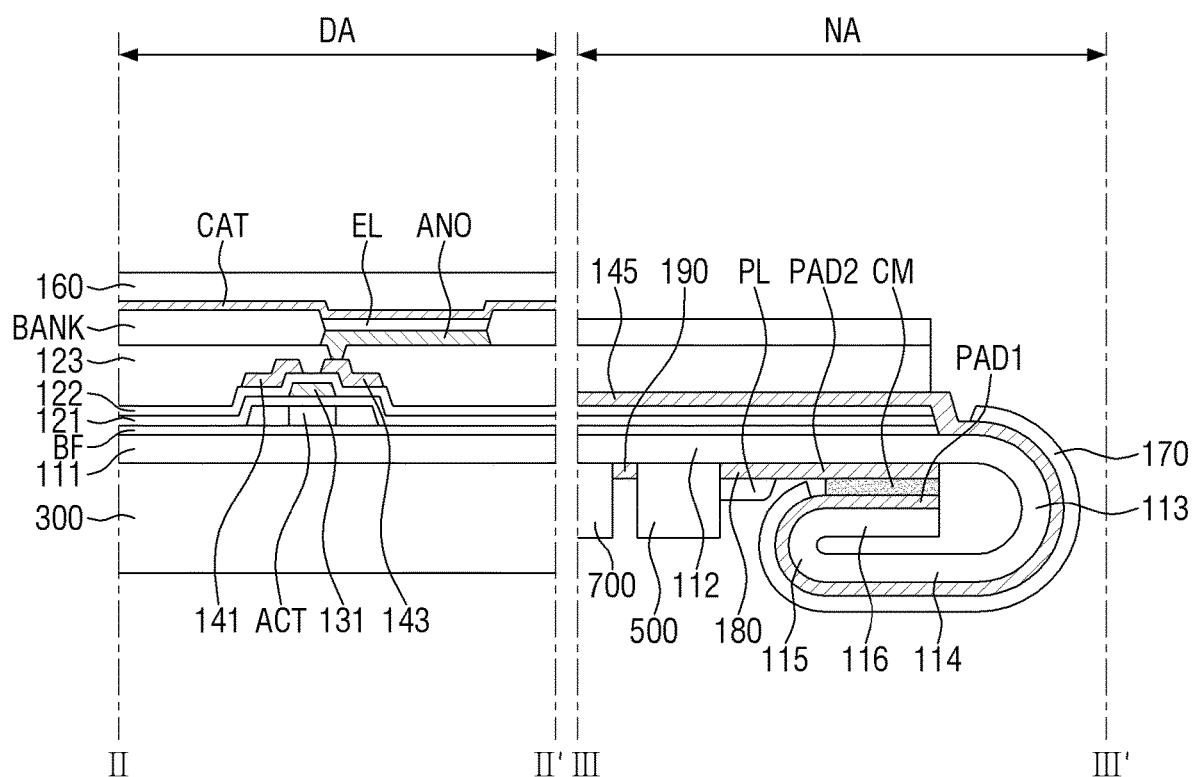
FIG. 3 shows a cross-sectional view of the display device taken along the lines II-II' and III-III' of FIG. 2.
Figure 4:
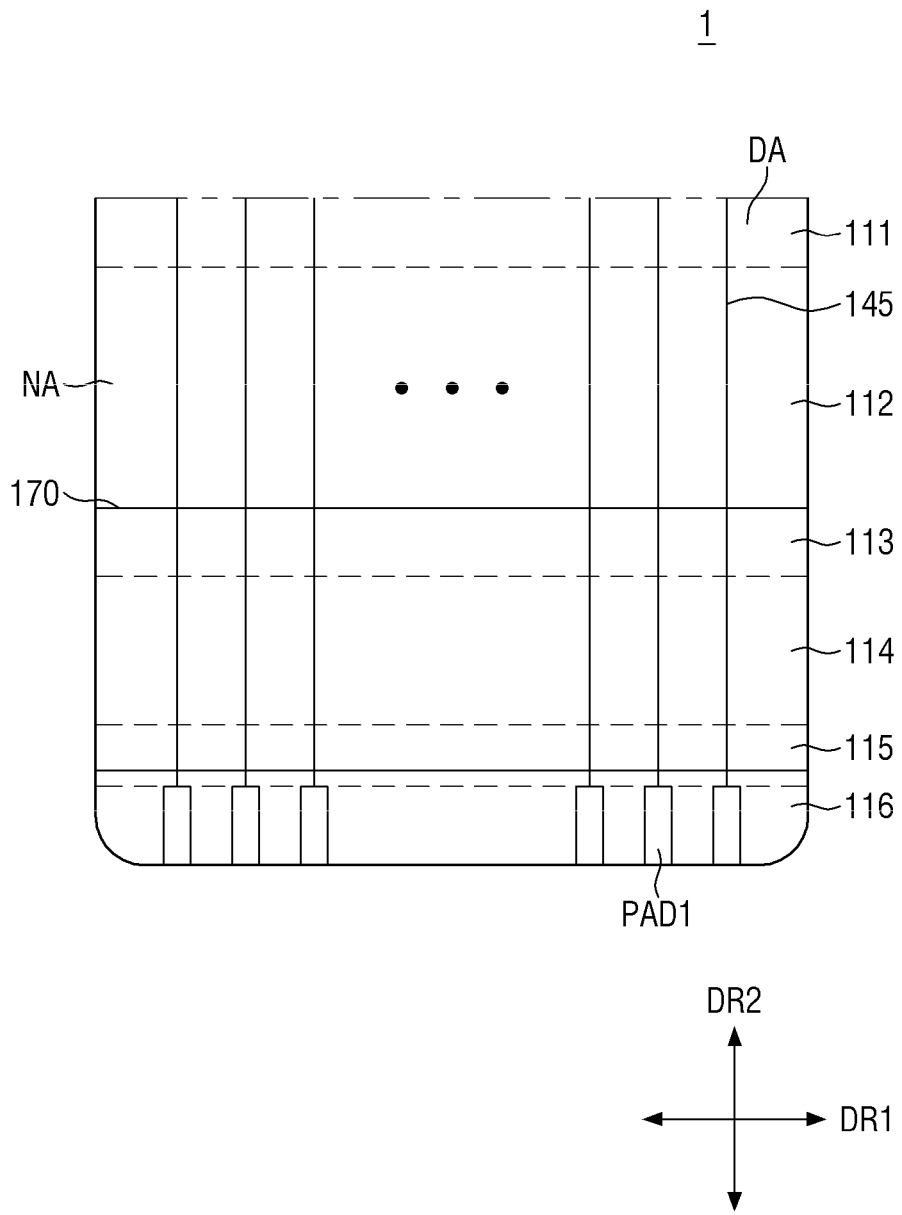
FIG. 4 is a plan view illustrating components disposed on a first surface of a display panel according to an example embodiment.
Figure 5:
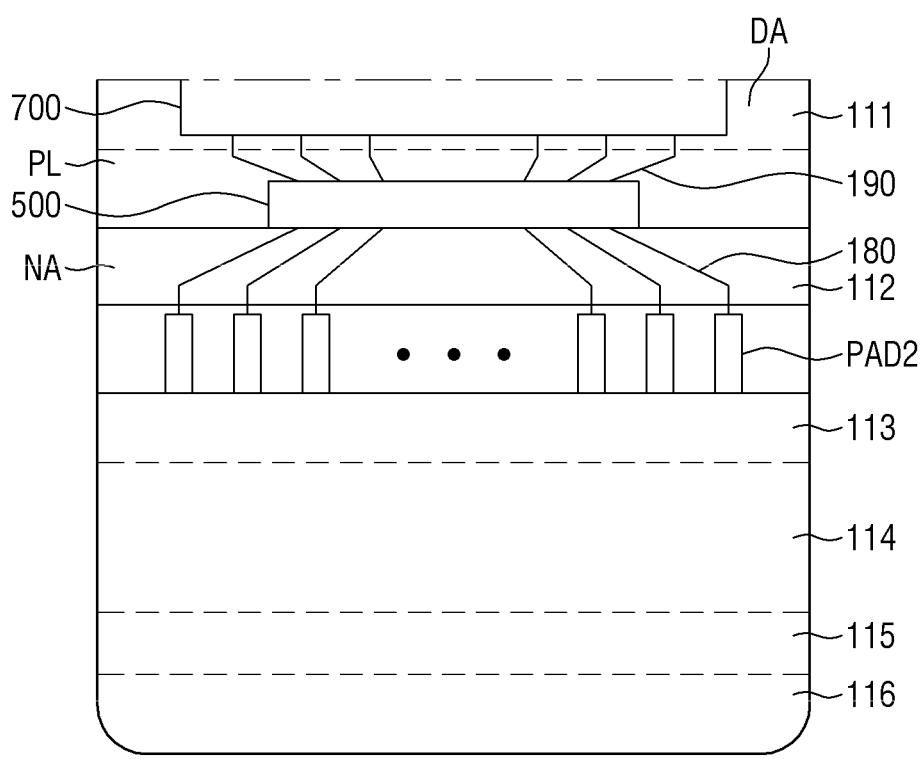
FIG. 5 is a plan view illustrating components disposed on a second surface of the display panel.

FIG. 1 is a plan view illustrating a display product including a plurality of display devices according to an example embodiment. FIG. 2 is a plan view illustrating a display device according to an example embodiment. FIG. 3 shows a cross-sectional view of the display device taken along the lines II-II' and III-III' of FIG. 2. FIG. 4 is a plan view illustrating components disposed on a first surface of a display panel according to an example embodiment; and FIG. 5 is a plan view illustrating components disposed on a second surface of the display panel.

A display device 1 is a device which displays a still image or a moving image. The display device 1 may be used in any of portable electronic devices, such as a mobile phone, a smartphone, a tablet personal computer (PC), a smart watch, a watch phone, a mobile communication terminal, an electronic notebook, an electronic book, a portable multimedia player (PMP), a navigation device, an ultra-mobile PC (UMPC), and may also be used as a display screen of various products, such as a television, a notebook, a monitor, a billboard, and a device for Internet of things (IoT).

Referring to FIGS. 1 to 5, in an example embodiment, the display device 1 may be a tiled display in which a plurality of display panels or a plurality of display devices are connected. As shown in FIG. 1, the plurality of display panels may be arranged in the form of a matrix arrangement in a first direction DR1 and a second direction DR2. In FIG. 1, five columns of display panels are illustrated as being arranged in the first direction DR1, and three rows of display panels are arranged in the second direction DR2. However, there is no limitation on the number of the display panels arranged in the first direction DR1 and the second direction DR2.

In the drawings subsequent to FIG. 1, one display panel or display device constituting the display device 1 according to an example embodiment will be mainly described.

Referring to FIG. 2, the display device 1 may include a display panel 100 configured to display an image, a support film 300 disposed below the display panel 100, a driving integrated circuit 500 disposed on the display panel 100, and a printed circuit board 700 disposed on the display panel 100 and connected to the driving integrated circuit 500.

The display panel 100 may be, for example, an organic light-emitting diode display panel. A case in which the display panel 100 is the organic light-emitting diode display panel will be described in the following example embodiments. However, the present disclosure is not limited thereto, and examples of the display panel 100 may include other types of display panels, such as a liquid crystal display (LCD) panel, a quantum dot organic light-emitting diode (QD-OLED) display panel, a quantum dot LCD (QD-LCD) panel, a quantum nano light-emitting display (QNED) panel, and a micro light-emitting display (LED) panel.

The display panel 100 includes a display region DA including a plurality of pixel regions PX and a non-display region NA disposed around the display region DA. In an embodiment, the display region DA may have a rectangular shape of which a corner has a right angle in a plan view or a rectangular shape of which a corner is rounded in a plan view. In an embodiment, the display region DA may have a short side and a long side. The short side of the display region DA may be a side extending in the first direction DR1. The long side of the display region DA may be a side extending in the second direction DR2. However, a planar shape of the display region DA is not limited to the rectangular shape, and the display region DA may have a circular shape, an elliptical shape, or other various shapes.

In an embodiment, the non-display region NA may be disposed adjacent to a lower short side of two short sides of the display region DA in the second direction DR2 of the drawing. However, the present disclosure is not limited thereto, and the non-display region NA may be disposed adjacent to the two short sides of the display region DA. Herein, it will be mainly described that the non-display region NA is adjacent to the lower short side of the two short sides of the display region DA in the second direction DR2. Of course, descriptions of the non-display region NA adjacent to the lower short side of the two short sides of the display region DA in the second direction DR2 of the drawing may be equally applied to the non-display region NA adjacent to an upper short side of the display region DA in the second direction DR2.

The support film 300 may be disposed in the display region DA of the display panel 100. The support film 300 may serve to support the display panel 100 in the display region DA. The support film 300 may be made of at least one selected from among polyethylene terephthalate (PET), polyimide (PI), polycarbonate (PC), polyethylene (PE), polypropylene (PP), polysulfone (PSF), polymethylmethacrylate (PMMA), triacetyl cellulose (TAC), and cycloolefin polymer (COP). In an embodiment, unlike what is illustrated in FIG. 1, the support film 300 may be partially disposed in the non-display region NA.

The driving integrated circuit 500 may be disposed in the non-display region NA of the display panel 100. When the display panel 100 includes a flexible substrate as described below, the driving integrated circuit 500 includes a chip on plastic (COP) disposed on the flexible substrate of the display panel 100. The driving integrated circuit 500 may be a data driving chip in which a data driving circuit and the like are integrated.

The driving integrated circuit 500 may be disposed on a surface in a direction opposite to a display surface of the display panel 100. That is, the driving integrated circuit 500 may be disposed on a lower surface of the display panel 100. The driving integrated circuit 500 may be connected to a plurality of signal wirings disposed on a surface in a direction of the display surface of the display panel 100. In the display device 1 according to an embodiment, connection wirings may be further disposed on the surface in the direction opposite to the display surface of the display panel 100, and the plurality of signal wirings and the driving integrated circuit 500 may be electrically connected through the connection wirings.

The printed circuit board 700 may be disposed in the non-display region NA of the display panel 100. The printed circuit board 700 may be electrically connected to the driving integrated circuit 500. The printed circuit board 700 may serve to apply a control signal for controlling the driving integrated circuit 500 to the driving integrated circuit 500.

Referring to FIG. 3, the display panel 100 may include a flexible substrate 110, a plurality of conductive layers, a plurality of insulating layers configured to insulate the conductive layers from each other, and a light-emitting organic layer EL.

The flexible substrate 110 is disposed in (e.g., in the entirety of) the display region DA and the non-display region NA. The flexible substrate 110 may serve to support various elements disposed thereon. In an embodiment, the flexible substrate 110 may be made of a flexible material.

Examples of a polymeric material of the flexible substrate may include polyether sulfone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. In an embodiment, the flexible substrate 110 may be a flexible substrate which is bendable, foldable, and rollable.

The flexible substrate 110 may have a first surface 110a in the direction of, or toward, the display surface and a second surface 110b in the direction opposite to the display surface.

The flexible substrate 110 may include first to sixth portions 111 to 116 sequentially disposed in a direction from an end in the display region DA to an opposite end in the non-display region NA. The first portion 111 may be disposed in the display region DA, and the second portion 112 to the sixth portion 116 may be disposed in the non-display region NA.

The first portion 111 of the flexible substrate 110 may serve to support upper conductive layers, insulating layers, the light-emitting organic layer EL, and the like, which will be described below.

The second portion 112 may be located at a side of the first portion 111 of the flexible substrate 110 in the second direction DR2. The third portion 113 may be located at a side of the second portion 112 of the flexible substrate 110. The fourth portion 114 may be located at a side of the third portion 113 of the flexible substrate 110. The fifth portion 115 may be located at a side of the fourth portion 114 of the flexible substrate 110. The sixth portion 116 may be located at a side of the fifth portion 115 of the flexible substrate 110. It may be understood that adjacent portions of the first to sixth portions 111 to 116 of the flexible substrate 110 are physically connected to each other.

In an embodiment, as shown in FIG. 3, the second portion 112, the fourth portion 114, and the sixth portion 116 of the flexible substrate 110 may include flat surfaces, and the third portion 113 and the fifth portion 115 of the flexible substrate 110 may include bent surfaces. However, the present disclosure is not limited thereto, and it may be understood that the second portion 112, the fourth portion 114, and the sixth portion 116 of the flexible substrate 110 may be partially bent to have a certain curvature, but may be substantially flat and may not be bent as compared with the third portion 113 and the fifth portion 115.

The third portion 113 and the fifth portion 115 of the flexible substrate 110 may include bent surfaces which are bent to have a certain curvature. For example, as shown in FIG. 3, the third portion 113 of the flexible substrate 110 may be bent in the direction opposite to the display surface, and the fifth portion 115 of the flexible substrate 110 is bent in the direction of the display surface. That is, the flexible substrate 110 may be flat at the first portion 111 and the second portion 112, be bent in the direction opposite to the display surface at the third portion 113, be flat at the fourth portion 114, be bent in the direction of the display surface at the fifth portion 115, and be flat at the sixth portion 116, which is an end of the flexible substrate 110.

In an embodiment, as shown in FIG. 3, a length of the third portion 113 in a direction from the third portion 113 to the fourth portion 114 of the flexible substrate 110 may be greater than a length of the fifth portion 115 in a direction from the fifth portion 115 to the sixth portion 116. In an embodiment, the sixth portion 116 located at a side of the fifth portion 115 of the flexible substrate 110 may not touch the second surface 110b of the flexible substrate 110 at the second portion 112 and may be located below the second surface 110b of the second portion 112 so as to be spaced apart (e.g., slightly spaced apart) from the second surface 110b of the second portion 112.

Similarly, in an embodiment, a length of the fourth portion 114 in a direction from the fourth portion 114 to the fifth portion 115 of the flexible substrate 110 may be greater than a length of the sixth portion 116 in the direction from the fifth portion 115 to the sixth portion 116. As a result, the sixth portion 116 of the flexible substrate 110 may not touch the second surface 110b of the flexible substrate 110 at the third portion 113 and may be located so as to be spaced apart (e.g., slightly spaced apart) from the second surface 110b of the third portion 113.

The second portion 112 of the flexible substrate 110 may be disposed to overlap the fourth portion 114 and the sixth portion 116 of the flexible substrate 110 in a thickness direction thereof. In addition, the second surface 110b at the second portion 112 of the flexible substrate 110 and the first surface 110a at the sixth portion 116 of the flexible substrate 110 may be disposed to face each other. Further, the second surface 110b at the fourth portion 114 of the flexible substrate 110 and the second surface 110b at the sixth portion 116 of the flexible substrate 110 may be arranged to face each other.

A buffer layer BF may be disposed on the flexible substrate 110. The buffer layer BF may prevent or substantially prevent external moisture and oxygen from permeating through the flexible substrate 110. In an embodiment, the buffer layer BF may include any of a silicon nitride ($SiN_x$) film, a silicon oxide ($SiO_2$) film, and an oxynitride ($SiO_xN_y$) film.

A semiconductor layer ACT may be disposed on the buffer layer BF. The semiconductor layer ACT forms a channel of a thin film transistor. The semiconductor layer ACT may be disposed in each pixel of the display region DA and may be disposed in the non-display region NA in some cases. The semiconductor layer ACT may include source/drain regions and an active region. In an embodiment, the semiconductor layer ACT may include polycrystalline silicon.

A first insulating layer 121 may be disposed on the semiconductor layer ACT. The first insulating layer 121 may be a gate insulating film having a gate insulating function. In an embodiment, the first insulating layer 121 may include a silicon compound, a metal oxide, or the like, which is an inorganic material. For example, the first insulating layer 121 may include silicon oxide, silicon nitride, silicon oxynitride, aluminum oxide, tantalum oxide, hafnium oxide, zirconium oxide, titanium oxide, or the like. These may be used alone or in combination with each other.

The first insulating layer 121 may be disposed above the first portion 111 and the second portion 112 of the flexible substrate 110 and may be removed or omitted from above the third to sixth portions 113 to 116. That is, flexibility of the flexible substrate 110 may be secured when the flexible substrate 110 is bent by removing or omitting the first insulating layer 121 above the third portion 113 at which the flexible substrate 110 starts to be bent. Similar to the first insulating layer 121, a second insulating layer 122 to be described below may be disposed above the first portion 111 and the second portion 112 and may be removed or omitted from above the third to sixth portions 113 to 116.

A first conductive layer may be disposed on the first insulating layer 121. The first conductive layer may include, for example, a gate electrode 131 of a thin film transistor TFT and a first electrode of a storage capacitor. In an embodiment, the first conductive layer may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single film or a stacked film made of one or more materials selected from the above-described materials.

The second insulating layer 122 may be disposed on the first conductive layer. The second insulating layer 122 may insulate the first conductive layer and a second conductive layer from each other. In an embodiment, the second insulating layer 122 may be made of a material selected from the above-described materials for the first insulating layer 121.

The second conductive layer may be disposed on the second insulating layer 122. The second conductive layer may include a source electrode 141, a drain electrode 143, and a plurality of signal wirings 145. In an embodiment, the second conductive layer may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the second conductive layer may be a single film made of one of the above-described materials. However, the present disclosure is not limited thereto, and the second conductive layer may be a stacked film. For example, the second conductive layer may have a stacked structure of Ti/Al/Ti, Mo/Al/Mo, Mo/AlGe/Mo, Ti/Cu, or the like. In an example embodiment, the second conductive layer may have a stacked structure of Ti/Al/Ti.

The source electrode 141 and the drain electrode 143 of the second conductive layer are disposed above the first portion 111 of the flexible substrate 110, and the plurality of signal wirings 145 of the second conductive layer may be disposed above the second to sixth portions 112 to 116 of the flexible substrate 110. The plurality of signal wirings 145 may be flat or bent along a shape of the flat surface or the bent surface of the flexible substrate 110 thereunder. That is, the signal wirings 145 disposed above the second portion 112, the fourth portion 114, and the sixth portion 116 of the flexible substrate 110 may be flat, and the signal wirings 145 disposed above the third portion 113 and the fifth portion 115 may be bent.

The signal wirings 145 disposed above the sixth portion 116 of the flexible substrate 110 may face the second surface 110b of the flexible substrate 110. The signal wirings 145 disposed above the sixth portion 116 of the flexible substrate 110 may be electrically coupled to first connection wirings 180 disposed on the second surface 110b at the second portion 112 of the flexible substrate 110 as described below.

In an embodiment, a bending protection film 170 may be disposed on the first surface 110a at the third to fifth portions 113 to 115 of the flexible substrate 110. The bending protection layer 170 may be bent to surround, cover, and protect the signal wirings 145 disposed on the first surface 110a of the third to fifth portions 113 to 115 of the flexible substrate 110 from the outside and may expose the signal wirings 145 above the sixth portion 116. The signal wirings 145 exposed by the bending protection layer 170 may define a first pad PAD1. The exposed first pad PAD1 of the signal wirings 145 may be coupled to the first connection wirings 180 to be described below.

Referring to FIG. 4, the plurality of signal wirings 145 may be arranged in the first direction DR1. Similarly, the first pads PAD1, which are end portions of the plurality of signal wirings 145, may be arranged in the first direction DR1.

Referring to FIG. 3 again, a third insulating layer 123 may be disposed on the second conductive layer. In an embodiment, the third insulating layer 123 may include an organic insulating material. The organic insulating material may include at least one selected from among a polyacrylate-based resin, an epoxy resin, a phenolic resin, a polyimide-based resin, a polyimide-based resin, an unsaturated polyester-based resin, a polyphenylene ether-based resin, a polyphenylene sulfide-based resin, and benzocyclobutene (BCB).

In an embodiment, similar to the first insulating layer 121 and the second insulating layer 122 described above, the third insulating layer 123 and a bank layer BANK to be described below, which are upper structures relative to the second conductive layer, may be removed or omitted from above the third portion 113, at which the flexible substrate 110 starts to be bent, to the sixth portion 116. An anode ANO is disposed on the third insulating layer 123. The anode ANO may be electrically connected to the drain electrode 143 through a contact hole passing through the third insulating layer 123.

The bank layer BANK may be disposed on the anode ANO. The bank layer BANK may be disposed in the display region DA and the non-display region NA and above the first portion 111 and the second portion 112 of the flexible substrate 110. The bank layer BANK may have a contact hole through which the anode ANO is exposed. The bank layer BANK may be made of an organic insulating material or an inorganic insulating material. For example, the bank layer BANK may be made of at least one selected from among a photoresist, a polyimide-based resin, an acrylic-based resin, a silicon compound, and a polyacrylic-based resin.

The light-emitting organic layer EL may be disposed on an upper surface of the anode ANO and in an opening of the bank layer BANK. A cathode CAT is disposed on the light-emitting organic layer EL and the bank layer BANK. The cathode CAT may be a common electrode disposed on a plurality of pixels.

A thin film encapsulation layer 160 is disposed on the cathode CAT. The thin film encapsulation layer 160 may be disposed in the display region DA. The thin film encapsulation layer 160 may cover an organic light-emitting diode OLED. In an embodiment, the thin film encapsulation layer 160 may be a stacked film in which an inorganic film and an organic film are alternately stacked. In an embodiment, the thin film encapsulation layer 160 may include a first encapsulating inorganic film, an encapsulating organic film, and a second encapsulating inorganic film, which are sequentially stacked.

The first connection wirings 180 may be disposed on the second surface 110b at the second portion 112 of the flexible substrate 110. A plurality of first connection wirings 180 may be electrically connected to the plurality of signal wirings 145 described above. As shown in FIG. 3, the first connection wirings 180 and the signal wirings 145 may be coupled to each other on the second surface 110b at the second portion 112 of the flexible substrate 110. In an embodiment, a conductive coupling member CM for coupling the first connection wirings 180 and the signal wirings 145 may be disposed between the first connection wirings 180 and the signal wirings 145. In an embodiment, the conductive coupling member CM may be an anisotropic conductive film (ACF).

In an embodiment, the first connection line 180 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the first connection line 180 may be a single film made of one of the above-described materials. However, the present disclosure is not limited thereto, and, in an embodiment, the first connection line 180 may be a stacked film made of silver. For example, the first connection line 180 may have a stacked structure of Ti/Al/Ti, Mo/Al/Mo, Mo/AlGe/Mo, Ti/Cu, or the like.

In an embodiment, a protective organic layer PL may be disposed on the second surface 110*b* at the second portion 112 of the flexible substrate 110. The protective organic layer PL may cover and protect the first connection wirings 180 on the second surface 110*b* at the second portion 112 of the flexible substrate 110 and may expose the first connection wirings 180 at an end region of the second portion 112 adjacent to the third portion 113 of the flexible substrate 110. The first connection wirings 180 exposed by the protective organic layer PL may define a second pad PAD2. The exposed second pad PAD2 of the first connection line 180 may be coupled to the first pad PAD1 described above.

As shown in FIG. 5, the protective organic layer PL may be disposed between the printed circuit board 700 and the second pad PAD2 in a plan view. However, the present disclosure is not limited thereto, and, in an embodiment, the protective organic layer PL may also be disposed to further extend upward in the second direction DR2 as compared with the driving integrated circuit 500 of the second surface 110*b* of the flexible substrate 110 in a plan view.

The driving integrated circuit 500 may be disposed on the second surface 110*b* of the second portion 112 of the flexible substrate 110 and may be electrically connected to the first connection wirings 180.

In an embodiment, second connection wirings 190 may further be disposed between the driving integrated circuit 500 and the printed circuit board 700. The second connection wirings 190 may electrically connect the driving integrated circuit 500 and the printed circuit board 700. In an embodiment, the second connection line 190 may be made of at least one selected from the above-described materials for the first connection line 180. In an embodiment, the second connection line 190 may be made of a same material as the first connection line 180, but the present disclosure is not limited thereto.

In the display device 1 according to an example embodiment, the signal wirings 145 may be disposed on the first surface 110*a* of the flexible substrate 110, and the first connection wirings 180 electrically connected to the signal wirings 145 and the driving integrated circuit 500 may be disposed on the second surface 110*b* of the flexible substrate 110. In an embodiment, the driving integrated circuit 500 may be mounted directly on the second surface 110*b* of the flexible substrate 110 without being mounted on a printed circuit board which increases the non-display region NA of the display device 1, thereby implementing the bezel-less display device 1.

Further, the signal wirings 145 and the first connection wirings 180, which serve to electrically connect the driving integrated circuit 500 and each transistor of the display region DA, may be coupled to each other on the second surface 110*b* at the second portion 112 of the flexible substrate 110, thereby implementing the bezel-less display device 1.

In an embodiment, the driving integrated circuit 500 may be disposed on the second surface 110*b* of the flexible substrate 110 without being disposed at an end portion of the flexible substrate 110, for example, the sixth portion 116, and, thus, the driving integrated circuit 500 may be stably attached. Further, it is possible to prevent or substantially prevent physical damage to the flexible substrate 110 itself generated in a process of attaching the driving integrated circuit 500 to the end of the flexible substrate 110, for example, the sixth portion 116 that is vulnerable to physical damage due to bending or the like, or prevent or substantially prevent a crack of the signal wirings 145 due to the physical damage.

Herein, a method of manufacturing the display device 1 according to an example embodiment will be described with reference to FIGS. 6 to 9.

FIGS. 6 to 9 are cross-sectional views illustrating a manufacturing process of a display device according to an example embodiment.

Figure 6:
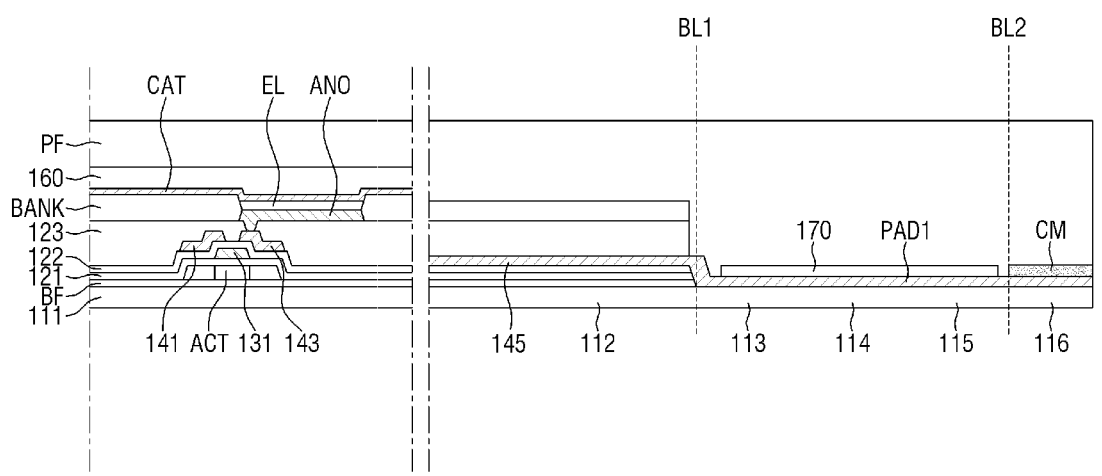
FIGS. 6 to 9 are cross-sectional views illustrating process operations of a display device according to an example embodiment.

Referring to FIG. 6, a protective film PF is disposed above the first to sixth portions 111 to 116 of the flexible substrate 110.

As shown in FIG. 6, the protective film PF may be disposed on the cathode CAT disposed above the first portion 111, the bank layer BANK disposed above the second portion 112, and the bending protection layer 170 and the conductive coupling member CM disposed above the third to sixth portions 113 to 116 of the flexible substrate 110 and the signal wirings 145.

The protective film PF may serve to support the flexible substrate 110 in order to form a support film 300*a* to be described below on the second surface 100*b* of the flexible substrate 110.

The protective film PF may be peeled off and removed from the flexible substrate 110 after a process of forming the support film 300*a* and a process of depositing the first and second connection wirings 180 and 190 to be described below. The protective film PF may be attached to the cathode CAT disposed above the first portion 111, the bank layer BANK disposed above the second portion 112, the bending protection layer 170 and the conductive coupling member CM disposed above the third to sixth portions 113 to 116 of the flexible substrate 110 and disposed on the signal wirings 145 with a certain bonding force, but, after a peeling process, an adhesive material may not remain thereon. To this end, bonding forces between the protective film PF and the cathode CAT above the first portion 111, between the protective film PF and the bank layer BANK disposed above the second portion 112, and between the protective film PF and the bending protection layer 170 and the conductive coupling member CM disposed above the third to sixth portions 113 to 116 of the flexible substrate 110 and disposed on the signal wirings 145 may be considered to be weak enough to easily peel the protective film PF off.

Figure 7:
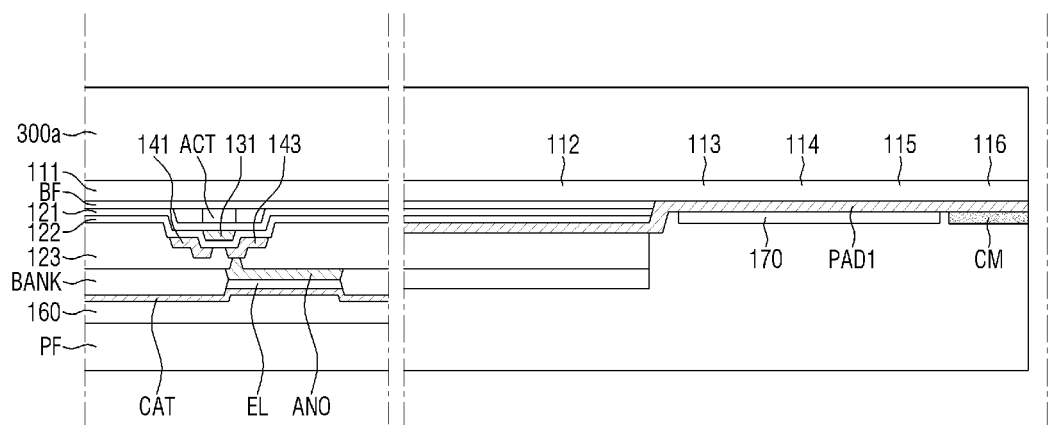

Referring to FIG. 7, the above-described support film 300*a* is disposed on the second surface 100*b* of the flexible substrate 110. The support film 300*a* may be disposed on the second surface 100*b* at the first to sixth portions 111 to 116 of the flexible substrate 110. The material and function of the support film 300*a* have been described with reference to the support film 300 of FIG. 3, and, thus, redundant descriptions thereof will be omitted.

Figure 8:
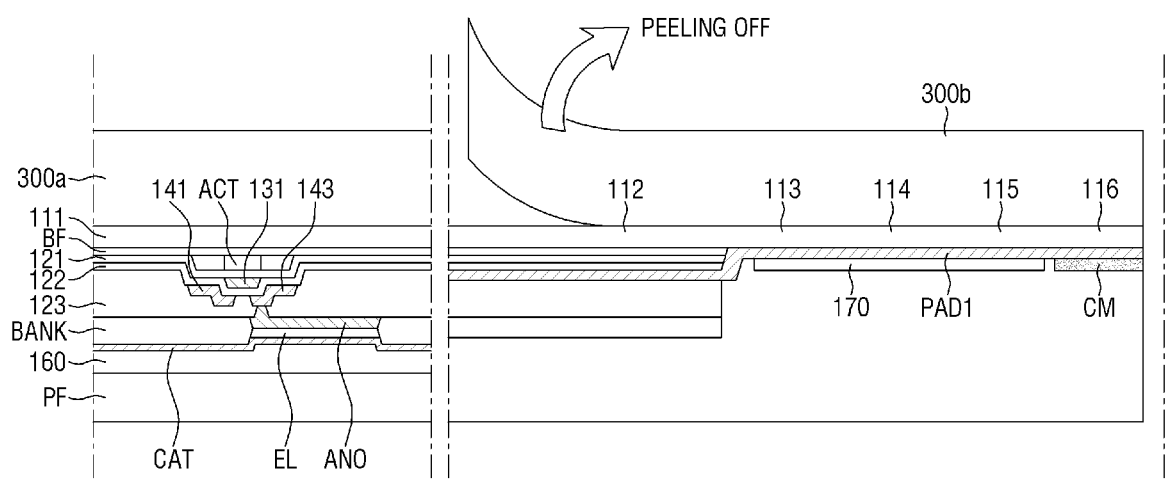

Referring to FIG. 8, excluding the support film 300a disposed to overlap the first portion 111 of the flexible substrate 110, regions of the support film 300a which are disposed to overlap the second to sixth portions 112 to 116 of the flexible substrate 110, are peeled off and removed.

The regions of the support film 300a, which are disposed to overlap the second to sixth portions 112 to 116 of the flexible substrate 110, may be peeled off and removed, and, thus, the first and second connection wirings 180 and 190 to be described below may be deposited on the second portion 112 of the flexible substrate 110.

In an embodiment, an operation of removing the regions of the support film 300a which are disposed to overlap the second to sixth portions 112 to 116 of the flexible substrate 110 may be performed using a scribing process. The scribing process may include scribing a boundary of the support film 300a corresponding to the first portion 111 and the second portion 112 of the flexible substrate 110.

In an embodiment, the scribing process may be performed using a heat knife or a laser member.

For example, when the scribing process is performed using the laser member or the heat knife, a burr (not shown) may be formed at a boundary of the support film 300a corresponding to a boundary between the first portion 111 and the second portion 112 of the flexible substrate 110.

Figure 9:
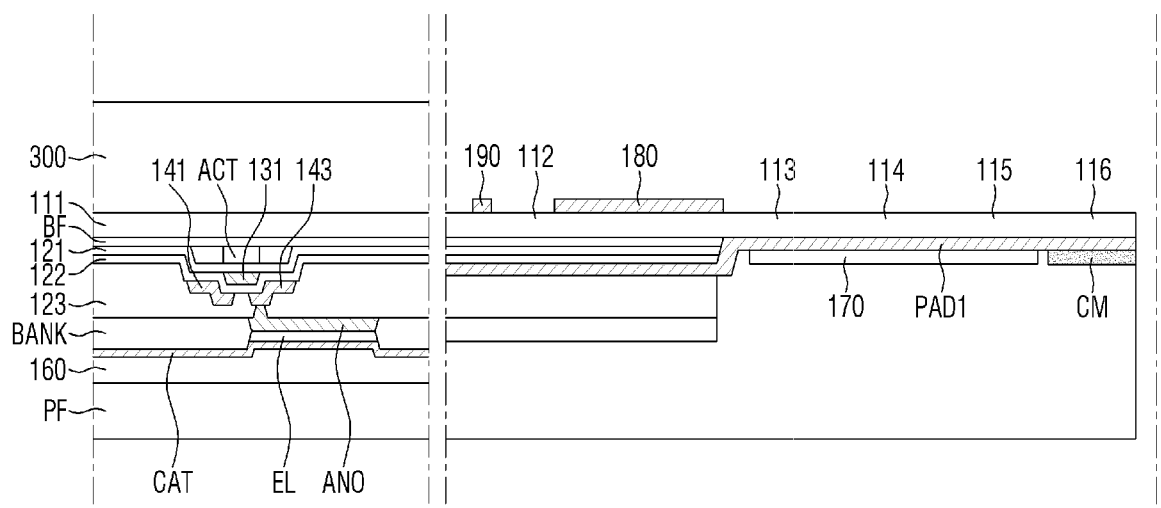

Referring to FIG. 9, the first connection wirings 180 and the second connection wirings 190 are deposited on the second surface 110b at the second portion 112 of the flexible substrate 110.

In an embodiment, the first connection wirings 180 and the second connection wirings 190 may be deposited through a same deposition process. That is, the first connection wirings 180 and the second connection wirings 190 may be formed in a same layer and may be made of a same material. The materials and functions of the first connection line 180 and the second connection line 190 have been described with reference to FIGS. 3 and 5, and, thus, redundant descriptions thereof will be omitted.

Herein, other example embodiments will be described. In the following example embodiments, the same reference numerals will be given to the same components as the example embodiments described above, and descriptions thereof will be omitted or simplified.

Figure 10:
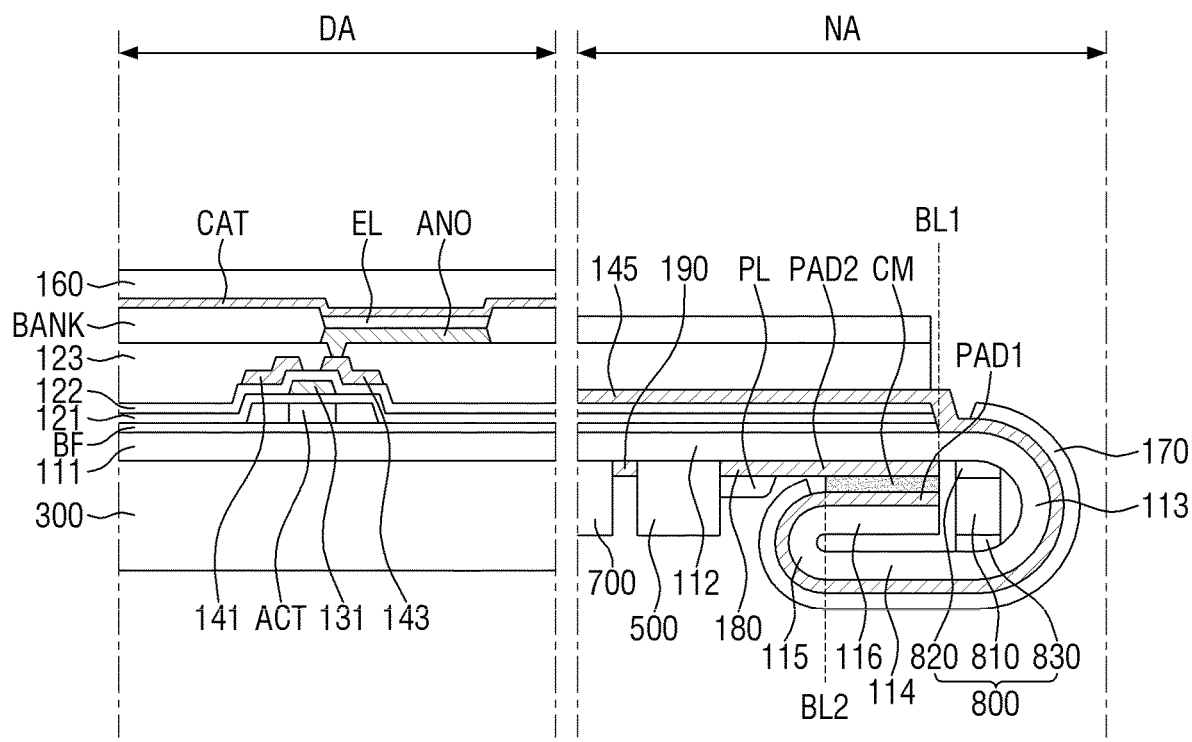
FIG. 10 is a cross-sectional view illustrating a display device according to another example embodiment.

FIG. 10 is a cross-sectional view illustrating a display device according to another example embodiment.

Referring to FIG. 10, a display device 2 according to the present example embodiment is different from the display device 1 described above in that the display device 2 further includes a bending coupling member 800.

More specifically, the display device 2 according to the present example embodiment may further include the bending coupling member 800 disposed in a space between a second surface 110b at a third portion 113 of a flexible substrate 110 and a sixth portion 116 of the flexible substrate 110. The bending coupling member 800 may be disposed to overlap the third portion 113 of the flexible substrate 110. Accordingly, when the flexible substrate 110 is bent, the bending coupling member 800 may serve to support the flexible substrate 110 and concurrently prevent or substantially prevent deformation of a bent shape of the flexible substrate 110 in a stepped space of the third portion 113 of the flexible substrate 110.

In an embodiment, the bending coupling member 800 may include a buffer material and may serve to absorb external and/or internal impacts applied to the flexible substrate 110, which is attached in a thickness direction thereof. However, the present disclosure is not limited thereto, and the bending coupling member 800 may not overlap the third portion 113 of the flexible substrate 110 and may be disposed between an adjacent second portion 112 and fourth portion 114.

In an embodiment, the bending coupling member 800 is not limited to a type of a member as long as the member has an adhesive function. For example, the bending coupling member 800 may include a double-sided tape. The bending coupling member 800 may include a tape substrate 810, a first adhesive layer 820 disposed between the flexible substrate 110 and one surface of the tape substrate 810 facing a display surface, and a second adhesive layer 830 disposed between the flexible substrate 110 and another surface of the substrate 810 facing in a direction opposite to the display surface.

In an embodiment, the tape substrate 810 may be made of at least one selected from among PET, PI, PC, PE, PP, PSF, PMMA, TAC, and COP. The first and second adhesive layers 820 and 830 may include at least one of a bonding layer, an adhesive layer, and a resin layer. For example, the first and second adhesive layers 820 and 830 may be made of at least one selected from polymer materials classified into a silicone-based polymer, a urethane-based polymer, a silicone-urethane (SU) hybrid polymer, an acrylic-based polymer, an isocyanate-based polymer, a polyvinyl alcohol-based polymer, a gelatin-based polymer, a vinyl-based polymer, a latex-based polymer, a polyester-based polymer, an aqueous polyester based-polymer, etc.

In an embodiment of the display device 2 according to the present example embodiment, signal wirings 145 may be disposed on a first surface 110a of the flexible substrate 110 and first connection wirings 180 electrically connected to the signal wirings 145 and a driving integrated circuit 500 may be disposed on the second surface 110b of the flexible substrate 110. That is, the driving integrated circuit 500 may be mounted directly on the second surface 110b of the flexible substrate 110 without being mounted on a printed circuit board which increases a non-display region NA of the display device 2, thereby implementing the bezel-less display device 2.

Further, the signal wirings 145 and the first connection wirings 180, which serve to electrically connect the driving integrated circuit 500 and each transistor of a display region DA, may be coupled to each other on the second surface 110b at the second portion 112 of the flexible substrate 110, thereby implementing the bezel-less display device 2.

In addition, the driving integrated circuit 500 may be disposed on the second surface 110b of the flexible substrate 110 without being disposed at an end portion of the flexible substrate 110, for example, the sixth portion 116, and, thus, the driving integrated circuit 500 may be stably attached. Further, it is possible to prevent or substantially prevent physical damage to the flexible substrate 110 itself which is generated in a process of attaching the driving integrated circuit 500 to the end of the flexible substrate 110, for example, the sixth portion 116 that is vulnerable to physical damage due to bending or the like, or prevent or substantially prevent a crack of the signal wirings 145 due to the physical damage.

Figure 11:
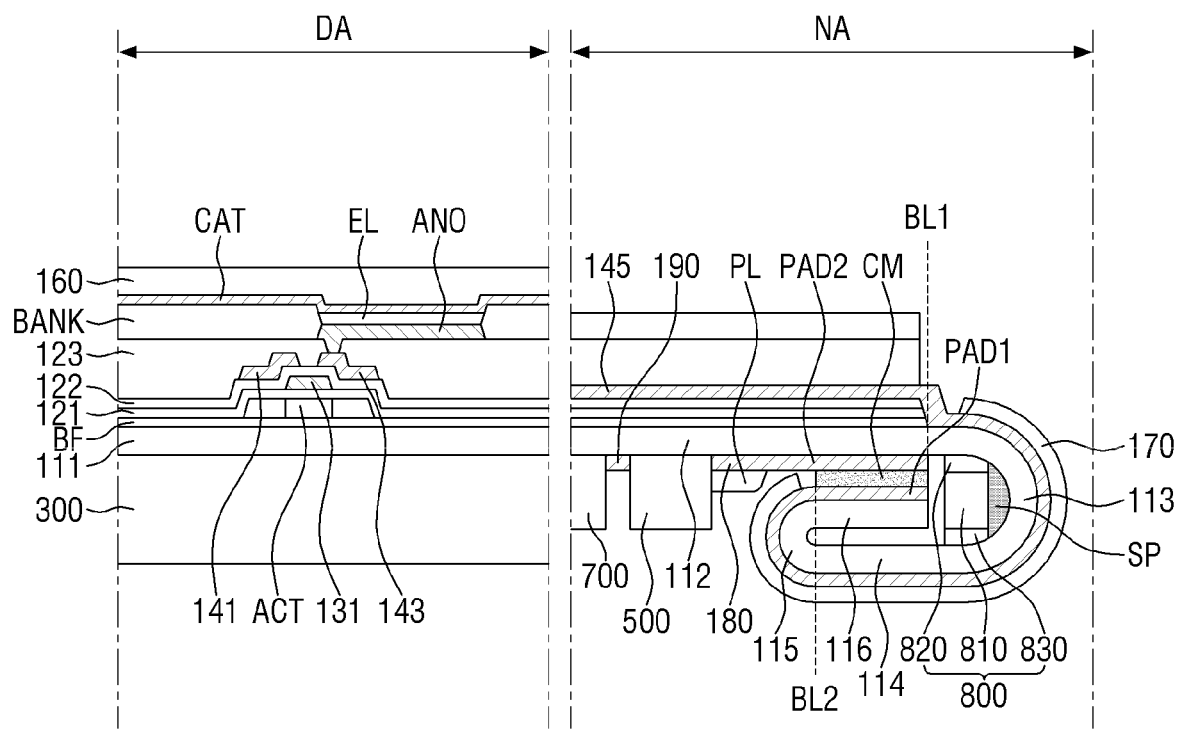
FIG. 11 is a cross-sectional view illustrating a display device according to another example embodiment.

FIG. 11 is a cross-sectional view illustrating a display device according to another example embodiment.

Referring to FIG. 11, a display device 3 according to the present example embodiment is different from the display device 2 of FIG. 10 in that the display device 3 further includes a spacer SP filling a space between the bending coupling member 800 described with reference to FIG. 10 and the second surface 110b at a third portion 113 the flexible substrate 110.

More specifically, the display device 3 according to the present example embodiment may further include the spacer SP filling the space between the bending coupling member 800 and the second surface 110b at the third portion 113 of the flexible substrate 110.

In an embodiment, the spacer SP may be in direct contact with the second surface 110b at the third portion 113 of the flexible substrate 110 and side surfaces of the bending coupling member 800. The spacer SP may fill the space between the bending coupling member 800 and the second surface 110b at the third portion 113 of the flexible substrate 110. Accordingly, when the flexible substrate 110 is bent, the spacer SP may serve to support the flexible substrate 110 and concurrently prevent or substantially prevent deformation of a bent shape of the flexible substrate 110 in a stepped space of the third portion 113 of the flexible substrate 110.

Figure 12:
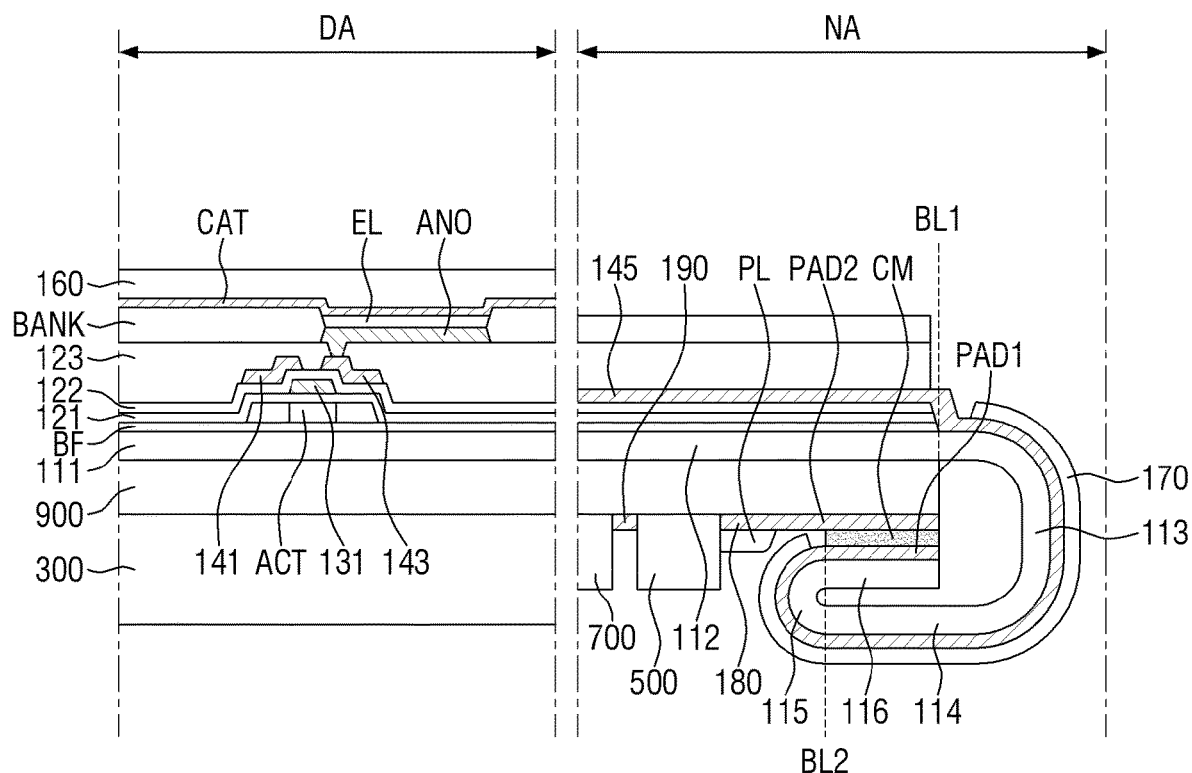
FIG. 12 is a cross-sectional view illustrating a display device according to another example embodiment.

FIG. 12 is a cross-sectional view illustrating a display device according to another example embodiment.

Referring to FIG. 12, a display device 4 according to the present example embodiment is different from the display device 1 described above in that a rigid substrate 900 is disposed below a flexible substrate 110.

More specifically, in the display device 4 according to the present example embodiment, the rigid substrate 900 may be further disposed below the flexible substrate 110. The rigid substrate 900 may be made of a rigid material, such as glass, quartz, or the like.

In the display device 4 according to the present example embodiment, a support film 300 disposed in a display region DA may be omitted, and the rigid substrate 900 may be disposed even in the display region DA. That is, as shown in FIG. 12, the rigid substrate 900 may be disposed on a first portion 111 and a second portion 112 of the flexible substrate 110. Third to sixth portions 113 to 116 of the flexible substrate 110 may extend outward from a side surface of the rigid substrate 900.

The rigid substrate 900 disposed below the flexible substrate 110 may serve to prevent or substantially prevent an external impact to the flexible substrate 110 and physical damage due to the external impact.

The lower structures (first and second connection wirings 180 and 190, driving integrated circuit 500, and printed circuit board 700) of the flexible substrate 110 described with reference to FIG. 3 may be disposed in regions of the rigid substrate 900, which are disposed to overlap the second portion 112 of the flexible substrate 110. That is, in an embodiment, the first and second connection wirings 180 and 190, the driving integrated circuit 500, and the printed circuit board 700 may be disposed directly on a lower surface of the rigid substrate 900.

In the display device 4 according to the present example embodiment, signal wirings 145 may be disposed on a first surface 110a of the flexible substrate 110, and the first connection wirings 180 electrically connected to the signal wirings 145 and the driving integrated circuit 500 may be disposed on a second surface 110b of the flexible substrate 110. That is, the driving integrated circuit 500 may be mounted on the second surface 110b of the flexible substrate 110 (mounted directly on the lower surface of the rigid substrate 900) without being mounted on a printed circuit board which increases a non-display region NA of the display device 4, thereby implementing the bezel-less display device 4.

Further, the signal wirings 145 and the first connection wirings 180, which serve to electrically connect the driving integrated circuit 500 and each transistor of a display region DA, may be coupled to each other on the second surface 110b at the second portion 112 of the flexible substrate 110, thereby implementing the bezel-less display device 4.

In addition, the driving integrated circuit 500 may be disposed on the second surface 110b of the flexible substrate 110 without being disposed at an end portion of the flexible substrate 110, for example, the sixth portion 116, and, thus, the driving integrated circuit 500 may be stably attached. Further, it is possible to prevent or substantially prevent physical damage to the flexible substrate 110 itself which is generated in a process of attaching the driving integrated circuit 500 to the end of the flexible substrate 110, for example, the sixth portion 116 that is vulnerable to physical damage due to bending or the like, or prevent or substantially prevent a crack of the signal wirings 145 due to the physical damage.

In some example embodiments, the support film 300 described with reference to FIG. 2 may be disposed below the flexible substrate 110 instead of the rigid substrate 900.

Figure 13:
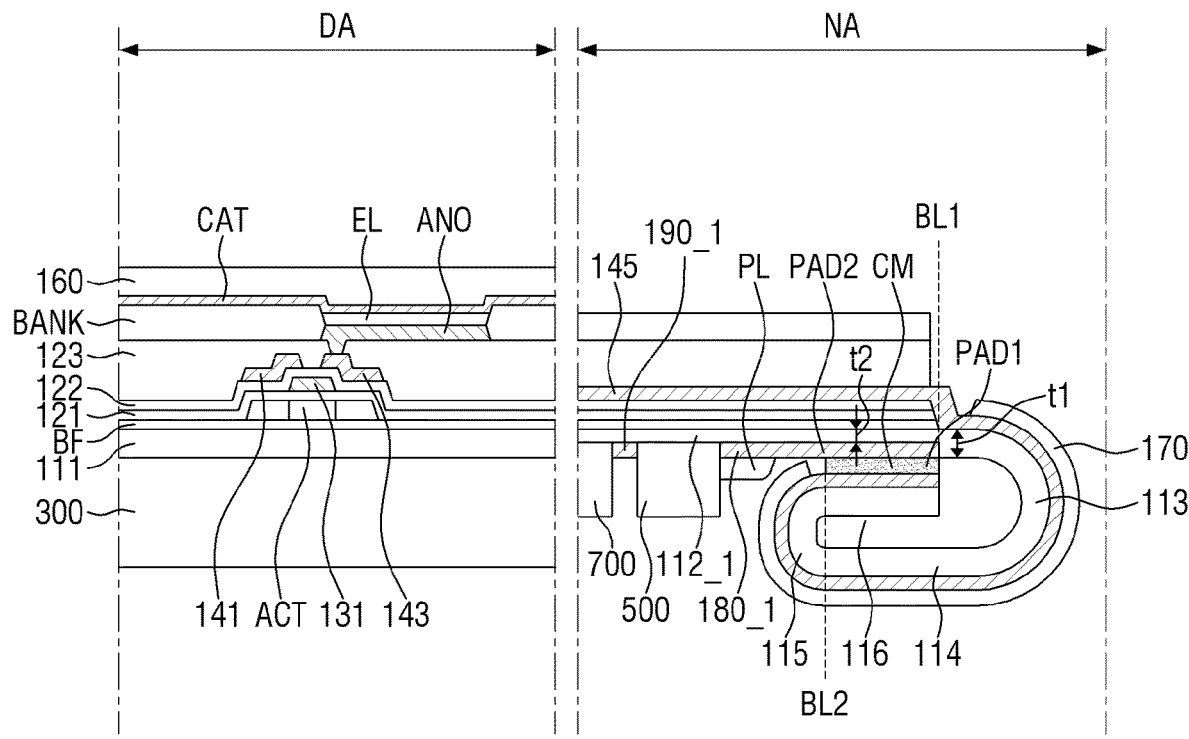
FIG. 13 is a cross-sectional view illustrating a display device according to another example embodiment.

FIG. 13 is a cross-sectional view illustrating a display device according to another example embodiment; and FIGS. 14 to 17 are cross-sectional views illustrating a manufacturing process of the display device according to another example embodiment.

Referring to FIGS. 13 to 17, a display device 5 according to the present example embodiment is different from the display device 1 described above in that connection wirings 180_1 and 190_1 and a driving integrated circuit 500 are disposed inward from a second surface 110b of a flexible substrate 110_1.

More specifically, in the display device 5 according to the present example embodiment, the connection wirings 180_1 and 190_1 and the driving integrated circuit 500 are disposed inward from the second surface 110b of the flexible substrate 110_1.

Such structures will be described with reference to cross-sectional views of the manufacturing process of the display device 5 according to FIGS. 14 to 17.

Figure 14:
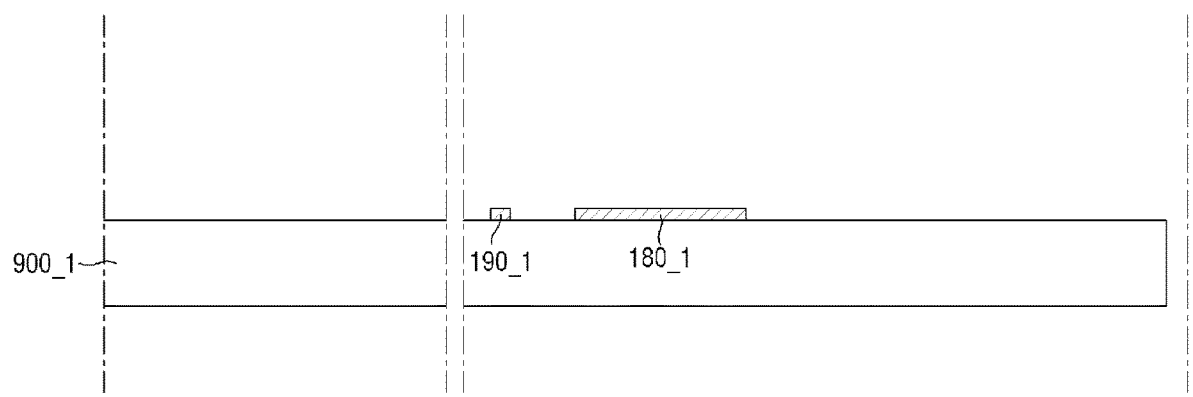
FIGS. 14 to 17 are cross-sectional views illustrating a manufacturing process of a display device according to an example embodiment.

Referring to FIG. 14, connection wirings 180-1 and 190-1 are formed on an upper surface of a support substrate 900_1. In an embodiment, the connection wirings 180-1 and 190-1 have substantially same materials and functions as the connection wirings 180 and 190 described with reference to FIG. 3, and, thus, redundant descriptions thereof will be omitted.

Figure 15:
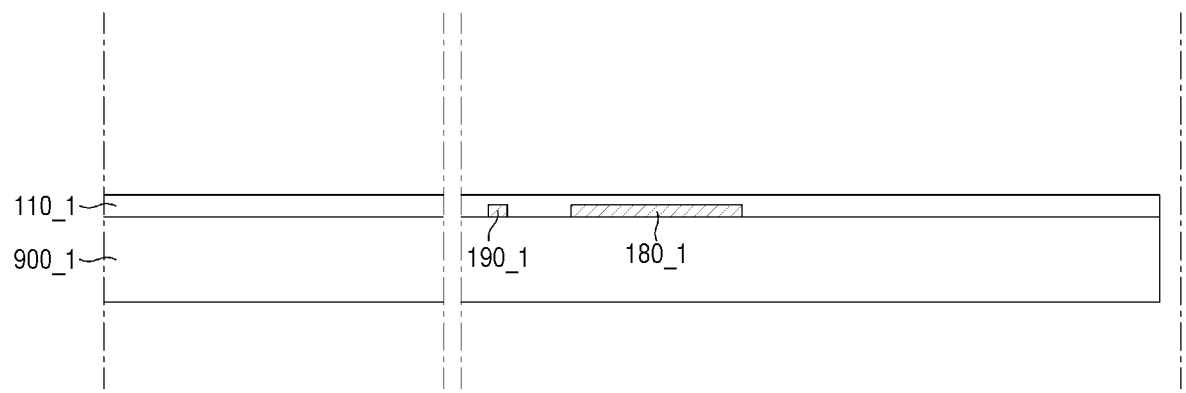

Referring to FIG. 15, the flexible substrate 110_1 is disposed on the upper surface of the support substrate 900_1 on which the connection wirings 180-1 and 190-1 are formed.

The flexible substrate 110_1 may be disposed to cover side surfaces and upper surfaces of the connection wirings 180-1 and 190-1. That is, a portion of the flexible substrate 110_1 overlapping the connection wirings 180-1 and 190-1 is thinner than a portion of the flexible substrate 110_1 not overlapping the connection wirings 180-1 and 190-1 due to the connection wirings 180-1 and 190-1. That is, as shown in FIG. 13, a second thickness t2 of the portion of the flexible substrate 110_1 overlapping the connection wirings 180-1 and 190-1 may be less than a first thickness t1 of the portion of the flexible substrate 110_1 not overlapping the connection wirings 180-1 and 190-1 due to the connection wirings 180-1 and 190-1.

Figure 16:
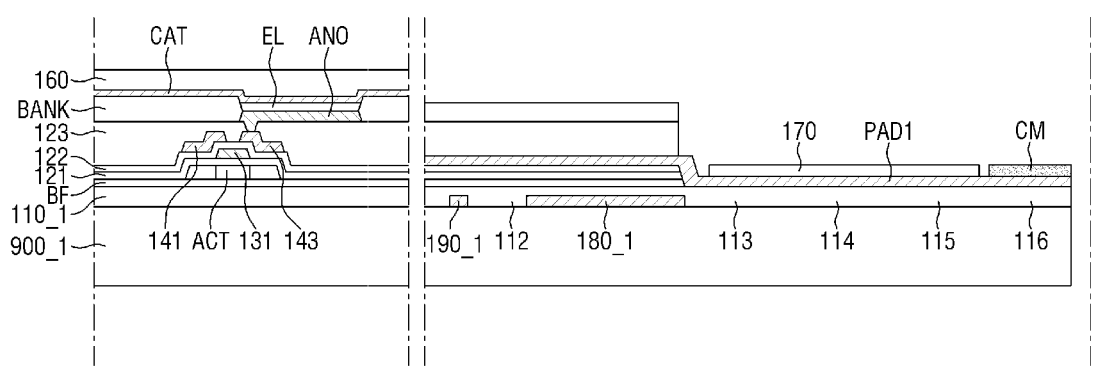
Figure 17:
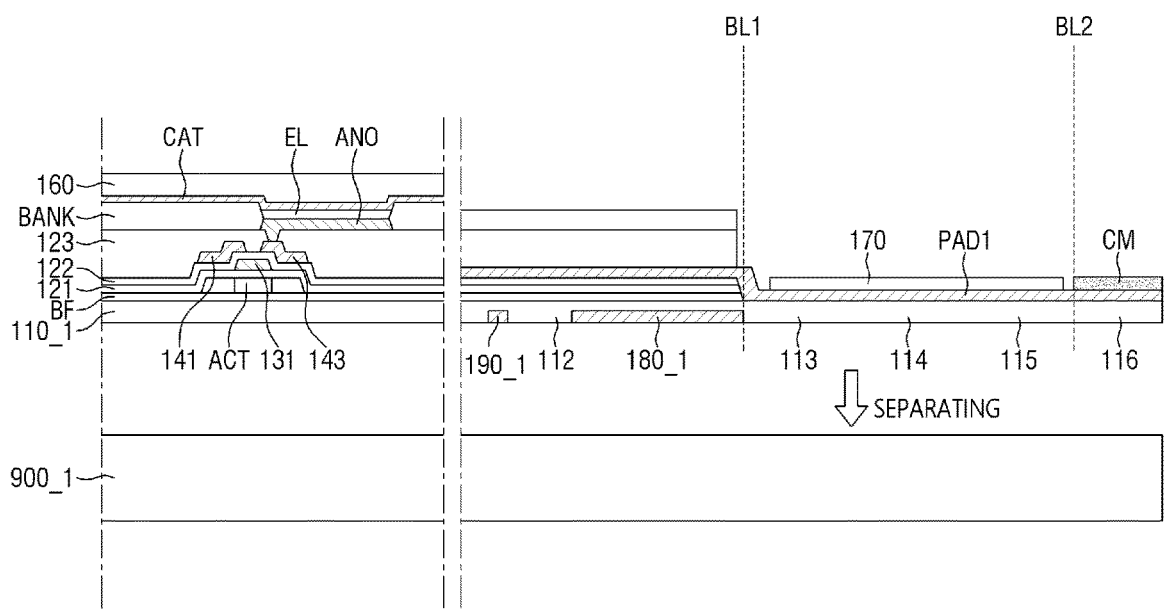

Referring to FIG. 16, various components of a display panel 100 are formed.

In an embodiment of the display device 5 according to the present example embodiment, signal wirings 145 may be disposed on an upper surface of the flexible substrate 110_1 and first connection wirings 180_1 electrically connected to the signal wirings 145 and the driving integrated circuit 500 may be disposed on a lower surface of the flexible substrate 110_1. That is, the driving integrated circuit 500 may be mounted directly on the lower surface of the flexible substrate 110_1 without being mounted on a printed circuit board which increases a non-display region NA of the display device 5, thereby implementing the bezel-less display device 5.

Further, the signal wirings 145 and the first connection wirings 180_1, which serve to electrically connect the driving integrated circuit 500 and each transistor of a display region DA, may be coupled to each other on the lower surface of the flexible substrate 110_1, thereby implementing the bezel-less display device 5.

In addition, the driving integrated circuit 500 may be disposed on the lower surface of the flexible substrate 110_1 without being disposed at an end portion of the flexible substrate 110_1, and, thus, the driving integrated circuit 500 may be stably attached. Further, it is possible to prevent or substantially prevent physical damage to the flexible substrate 110_1 itself which is generated in a process of attaching the driving integrated circuit 500 to the end of the flexible substrate 110_1 that is vulnerable to physical damage due to bending or the like, or prevent or substantially prevent a crack of the signal wirings 145 due to the physical damage.

According to embodiments of the present disclosure, there may be provided a display device in which cracks of signal wirings of a driver of a flexible substrate are prevented or substantially prevented when a driving integrated circuit is mounted.

However, aspects and effects of the present disclosure are not restricted to the example embodiments set forth herein, and other various aspects and effects are included in or may be learned from this description.

Although some example embodiments of the present disclosure have been described above, these are merely examples and do not limit the present disclosure. Further, the present disclosure may be changed and modified in various ways, without departing from the features of the present disclosure, by those skilled in the art. For example, the components described in the example embodiments of the present disclosure may be modified. Differences related to these modifications and applications should be construed as being within the scope of the present disclosure defined by the claims.

What is claimed is:

1. A display device, which comprises a display region comprising a plurality of pixels and a non-display region at a side of the display region, the display device comprising:
    a flexible substrate comprising a first surface and a second surface opposite to the first surface, the flexible substrate comprising, sequentially, a first portion in the display region, a second portion in the non-display region, a third portion bent in a direction away from a display surface, a fourth portion, a fifth portion bent in a direction toward the display surface, and a sixth portion;
    a plurality of signal wirings on the first surface at the second to sixth portions of the flexible substrate; and
    a plurality of first connection wirings on the second surface at the second portion of the flexible substrate,
    wherein the second portion overlaps with the fourth portion, the fifth portion, and the sixth portion, and
    the signal wirings and the first connection wirings are coupled to each other on the second surface at the second portion of the flexible substrate.

2. The display device of claim 1, wherein the first portion, the second portion, the fourth portion, and the sixth portion of the flexible substrate comprise flat surfaces.

3. The display device of claim 2, wherein a width of the third portion of the flexible substrate in the direction toward the display surface is greater than a width of the fifth portion in the direction toward the display surface.

4. The display device of claim 3, further comprising a driving integrated circuit on the second surface at the second portion of the flexible substrate,
    wherein the first connection wirings are electrically connected to the driving integrated circuit.

5. The display device of claim 4, further comprising a printed circuit board and second connection wirings on the second surface of the flexible substrate,
    wherein the second connection wirings electrically connect the printed circuit board and the driving integrated circuit.

6. The display device of claim 5, wherein the first connection wirings and the second connection wirings are directly on the second surface of the flexible substrate.

7. The display device of claim 3, further comprising a space and a double-sided tape, wherein the space is located between the third portion and the sixth portion of the flexible substrate, and the double-sided tape is located in the space.

8. The display device of claim 7, further comprising a spacer between the third portion of the flexible substrate and the double-sided tape,
    wherein the spacer is in direct contact with the third portion of the flexible substrate and a side surface of the double-sided tape.

9. The display device of claim 3, further comprising a driving integrated circuit on the second surface at the second portion of the flexible substrate,
    wherein the first connection wirings are electrically connected to the driving integrated circuit.

10. The display device of claim 3, further comprising a conductive coupling layer between the signal wirings and the first connection wirings,
    wherein the conductive coupling layer electrically couples the signal wirings and the first connection wirings.

11. The display device of claim 3, further comprising a bending protection layer on the second surface at the third to fifth portions of the flexible substrate and exposes the first connection wirings on the sixth portion.

12. The display device of claim 3, further comprising a rigid substrate on the second surface at the first portion and the second portion of the flexible substrate, the rigid substrate comprising a third surface in contact with the flexible substrate and a fourth surface opposite to the third surface,
    wherein the first connection wirings are directly on the fourth surface of the rigid substrate.

13. The display device of claim 3, wherein the first connection wirings are recessed from the second surface of the flexible substrate and are located inside the flexible substrate.

14. The display device of claim 1, wherein each pixel of the display region includes at least one thin film transistor, and the signal wirings are electrically connected to the thin film transistor.

15. A display device, which comprises a display region comprising a thin film transistor and a non-display region at a side of the display region, the display device comprising:
- a flexible substrate comprising a first surface and a second surface opposite to the first surface, the flexible substrate comprising, sequentially, a first portion in the display region, a second portion in the non-display region, a third portion bent in a direction opposite to a display surface, a fourth portion, a fifth portion bent in a direction toward the display surface, and a sixth portion;
- a first conductive layer on the first surface of the flexible substrate;
- a second conductive layer on the first conductive layer; and
- a plurality of first connection wirings on the second surface at the second portion of the flexible substrate,
- wherein the first conductive layer comprises a gate electrode on the first portion,
- the second conductive layer comprises a source electrode and a drain electrode on the first portion and a plurality of signal wirings on the second to sixth portions,
- the second portion overlaps the fourth portion, the fifth portion, and the sixth portion, and
- the signal wirings and the first connection wirings are coupled to each other on the second surface at the second portion of the flexible substrate.

16. The display device of claim 15, wherein the first portion, the second portion, the fourth portion, and the sixth portion of the flexible substrate comprise flat surfaces.

17. The display device of claim 16, wherein a width of the third portion of the flexible substrate in the direction toward the display surface is greater than a width of the fifth portion in the direction toward the display surface.

18. The display device of claim 17, further comprising a driving integrated circuit on the second surface at the second portion of the flexible substrate,
- wherein the first connection wirings are electrically connected to the driving integrated circuit.

19. The display device of claim 18, further comprising a printed circuit board and second connection wirings on the second surface of the flexible substrate,
- wherein the second connection wirings electrically connect the printed circuit board and the driving integrated circuit.

20. The display device of claim 19, wherein the first connection wirings and the second connection wirings are directly on the second surface of the flexible substrate.

* * * * *